United States Patent [19]
Garde

[11] Patent Number: 4,769,564
[45] Date of Patent: Sep. 6, 1988

[54] SENSE AMPLIFIER

[75] Inventor: Douglas Garde, Dover, Mass.

[73] Assignee: Analog Devices, Inc., Norwood, Mass.

[21] Appl. No.: 124,360

[22] Filed: Nov. 20, 1987

Related U.S. Application Data

[63] Continuation of Ser. No. 51,085, May 15, 1987, abandoned.

[51] Int. Cl.[4] .................. H03K 5/24; H03K 3/356; G11C 11/40; G11C 7/00
[52] U.S. Cl. ................... 307/530; 307/355; 307/279; 307/246; 365/181; 365/196; 365/208
[58] Field of Search ............ 307/530, 279, 246, 355, 307/362; 365/104, 181, 190, 196, 208

[56] References Cited

U.S. PATENT DOCUMENTS

| | | | |
|---|---|---|---|
| 3,657,575 | 4/1972 | Taniguchi | 307/304 |
| 3,870,966 | 3/1975 | Dingwall | 330/30 |
| 3,956,708 | 5/1976 | Musa | 330/30 |
| 3,964,031 | 6/1976 | Eaton, Jr. | 365/181 X |
| 3,978,459 | 8/1976 | Koo | 340/173 |
| 3,986,041 | 10/1976 | Buckley | 307/304 |
| 3,990,056 | 11/1976 | Luisi et al. | 365/181 X |
| 4,169,233 | 9/1979 | Haraszti | 307/355 |
| 4,247,791 | 1/1981 | Rovell | 307/355 |
| 4,375,039 | 2/1983 | Yamauchi | 307/530 |
| 4,412,237 | 10/1983 | Matsumura et al. | 307/279 X |
| 4,417,160 | 11/1983 | Schade | 307/353 |
| 4,456,841 | 6/1984 | Lam | 307/530 |
| 4,467,456 | 8/1984 | Oritani | 365/190 |
| 4,504,748 | 3/1985 | Oritani | 307/530 |
| 4,506,349 | 3/1986 | Mazin | 365/189 |
| 4,509,147 | 4/1985 | Tanimura | 365/190 |
| 4,551,641 | 11/1985 | Pelley | 307/530 |
| 4,558,241 | 12/1985 | Suzuki et al. | 307/279 X |
| 4,563,754 | 1/1986 | Aoyama | 365/190 |
| 4,601,533 | 8/1986 | Miyamoto | 307/530 |
| 4,604,554 | 8/1986 | Pricer | 307/530 |

FOREIGN PATENT DOCUMENTS

| | | | |
|---|---|---|---|
| 0094574 | 7/1981 | Japan | 365/181 |
| 0147998 | 8/1985 | Japan | 365/190 |

Primary Examiner—Stanley D. Miller
Assistant Examiner—David R. Bertelson
Attorney, Agent, or Firm—Wolf, Greenfield & Sacks

[57] ABSTRACT

A MOS sense amplifier having a differential input and a single-ended output, and formed of only six MOS transistors. The amplifier's non-inverting input is connected to the gates of first and second MOSFETs. The drains of the first and second MOSFETs are connected to each other and to the gates of third and fourth MOSFETs. The drain of the third MOSFET is connected to the sources of the second and sixth MOSFETs; and the source of the third MOSFET is connected to the positive supply voltage. The drain of the fourth MOSFET is connected to the sources of the first and fifth MOSFETs. The source of the fourth MOSFET is connected to ground. The inverting input of the sense amplifier is connected to the gates of the fifth and sixth MOSFETs. The drains of the fifth and sixth MOSFETs are connected to each other and provide the output terminus of the amplifier. The first, fourth and fifth MOSFETs are n-channel devices, while the second, third and sixth MOSFETs are p-channel devices.

1 Claim, 1 Drawing Sheet

SENSE AMPLIFIER

This application is a continuation of application Ser. No. 051,085, filed May 15, 1987, abandoned.

FIELD OF THE INVENTION

This invention relates to the field of memory devices for digital computers and, more specifically, to a sense amplifier for a random access read/write memory (RAM) cell fabricated using metal oxide semiconductor (MOS) components.

BACKGROUND OF THE INVENTION

Random access read/write memory devices are generally assembled from a matrix or other grouping of memory cells. Each such cell is capable of storing one binary digit, or bit, of information. A conventional prior art RAM device has the form generally illustrated in FIG. 1, wherein each memory cell $MC_{xy}$ (where x and y are indices in a two-dimensional matrix) is connected to a pair of conductors $B_x$ and $B^*_x$. The conductors $B_x$ and $B^*_x$ are typically called bit lines, bit-sense lines, or bit buses. In the figure, a portion of a column of the matrix is shown for the value $x=i$, from rows $y=j$ through $y=j+n-1$. Bit lines $B_x$ and $B^*_x$ normally carry signals of complementary values imposed by a differential output stage in, for example, a write amplifier or memory cell. For reading the contents of a cell, a differential voltage representing those contents is provided via bit lines $B_x$ and $B^*_x$ to a sense amplifier 10. The conventional sense amplifier typically has a differential input stage to receive the signals imposed on the bit lines and a double-ended (i.e., differential) output for driving subsequent amplifier stages.

Sense amplifier design has a substantial impact on the performance of a RAM. The two most important characteristics of a RAM influenced by its sense amplifiers are the speed of a read operation and the power consumption of the device. Often, these two factors work against each other; more power is frequently required when faster switching speed is desired of an amplifier. A good sense amplifier, though, should switch states rapidly, draw little power, be reliable and be inexpensive to produce.

Noise immunity is also very much dependent on sense amplifier design. A sense amplifier should operate over a wide range of input voltages and be minimally sensitive to power supply fluctuations and common mode signals appearing on the bit lines, while being maximally sensitive (i.e., provide high gain) to differential signals appearing on those same conductors.

Minimization of sense amplifier power consumption during quiescent conditions is particularly important. At any instant, a typical RAM chip or array of chips will usually have very few sense amplifiers engaged in switching compared to the number of sense amplifiers sitting idly under quiescent conditions. Therefore, if the RAM chip is to dissipate only a small amount of power, quiescent current drain by the sense amplifiers must be minimized.

Many designs have been proposed for MOS sense amplifiers and many techniques have been advocated for providing faster, lower-power-consumption sense amplifiers. Among these techniques are bit line equalization (pre-charging) and address transition detection. The prior art also includes sense amplifiers using complementary MOSFET devices on both sides of a differential amplifier, with gate inputs configured to effect voltage swing without providing a high conductance current path and the use of shunt-connected devices driven by complementary outputs in place of active load resistances, to improve common mode rejection. Further, the art includes the use of a number of feedback arrangements to improve switching speed and other characteristics.

These various improvements are achieved in the prior art at the expense of increasing the number of components in each sense amplifier, generally with an attendant increase in the area of the semiconductor required for each sense amplifier and possibly consuption of unnecessary power.

Therefore, it is an object of the present invention to provide an improved sense amplifier.

Another object of the invention is to provide a sense amplifier which reduces power dissipation and still provides high speed operation.

BRIEF SUMMARY OF THE INVENTION

The foregoing and other objects and advantages of the present invention are achieved with a sense amplifier which has a differential input but only a single-ended output. This sense amplifier is formed of only six MOS transistors but has excellent common mode rejection properties, low power drain, fast switching characteristics and excellent common node rejection.

In an exemplary embodiment, the non-inverting input is connected to the gates of a first MOSFET and a second MOSFET. The drains of the first and second MOSFETs are connected to each other and to the gates of third and fourth MOSFETs. The drain of the third MOSFET is connected to the sources of the second and sixth MOSFETs; and the source of the third MOSFET is connected to the positive supply voltage. The drain of the fourth MOSFET is connected to the sources of the first and fifth MOSFETs. The source of the fourth MOSFET is connected to ground. The inverting input of the sense amplifier is connected to the gates of the fifth and sixth MOSFETs. The drains of the fifth and sixth MOSFETs are connected to each other and provide the output terminus of the amplifier. The first, fourth and fifth MOSFETs are n-channel devices, while the second, third and sixth MOSFETs are p-channel devices.

The sense amplifier thus has the desirable property of being formed entirely from MOS devices. Further, it has no pull-up resistances (either active or passive).

The invention will be more fully understood from the detailed description set forth below, which should be read in conjunction with the accompanying drawing. The invention is defined in the claims appended at the end of the detailed description, such description being exemplary only.

DETAILED DESCRIPTION OF AN ILLUSTRATIVE EMBODIMENT

Figure 1:
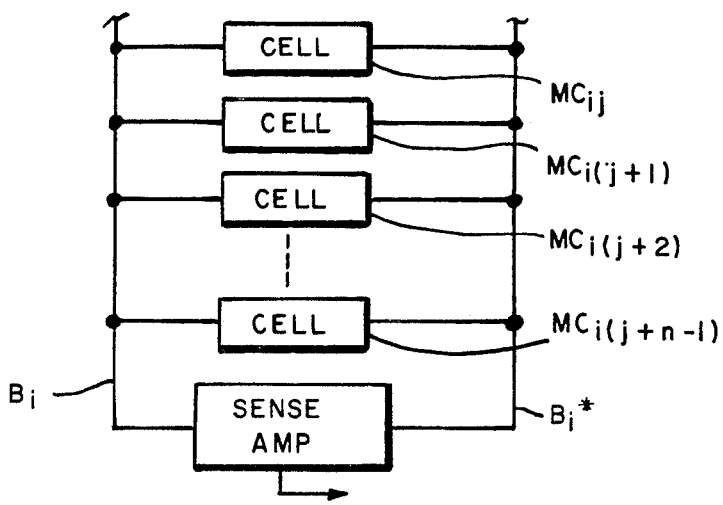
FIG. 1 is a block diagram of a prior art RAM illustrating the general architecture of such devices.
Figure 2:
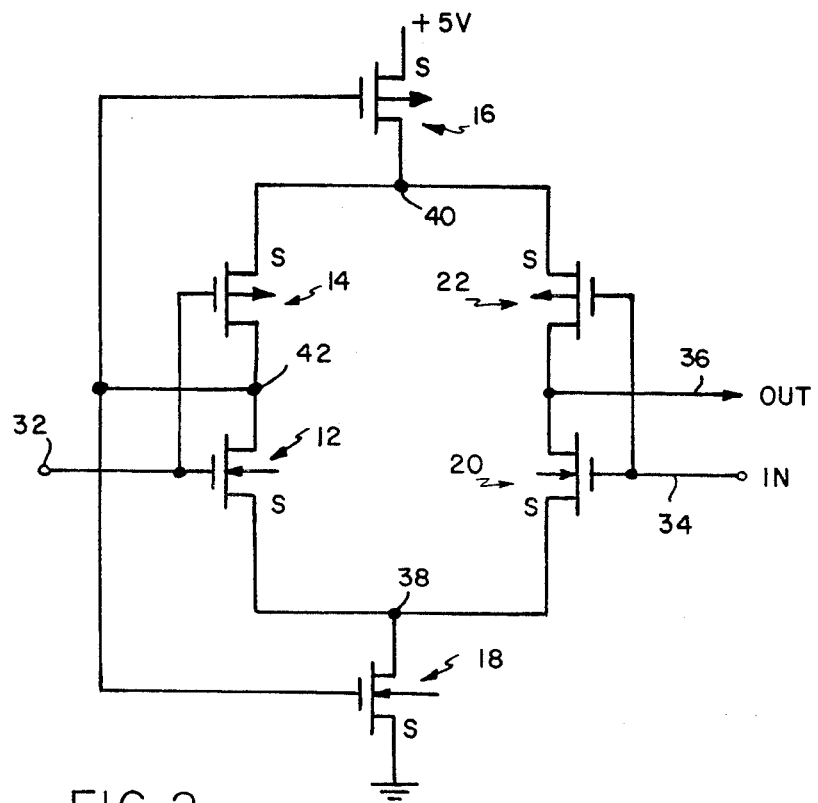
FIG. 2 is a schematic circuit diagram of the present invention for use in a MOS RAM device such as that shown in FIG. 1.

FIG. 2 shows a sense amplifier 10 according to the present invention. Amplifier 10 is formed from six metal oxide semiconductor field effect transistors (MOSFETs) 12-22. It has a non-inverting input 32 for receiving a non-inverting input signal represented by the label IN+ and an inverting input 34 for receiving an inverting input signal represented by the label IN−. The output of the amplifier appears on the lead 36, labeled OUT.

The non-inverting input 32 is connected to the gates of first MOSFET 12 and second MOSFET 14. The drain of the first MOSFET 12 and the drain of the second MOSFET 14 are connected to each other and to the gates of third and fourth MOSFETs 16 and 18. The drain of the third MOSFET 16 is connected to the source of the second MOSFET 14 and the source of the third MOSFET 16 is connected to the positive supply voltage. The drain of the fourth MOSFET 18 is connected to the source of the first MOSFET 12 and the source of the fourth MOSFET 18 is connected to ground.

The inverting input 34 of the sense amplifier is connected to the gates of fifth and sixth MOSFETs 20 and 22. The drain of the fifth MOSFET 20 and the drain of the sixth MOSFET 26 are connected to each other and provide the output terminus 36 of the amplifier. Further, the source of the fifth MOSFET 20 is connected to the juncture 38 of the first MOSFET's source and the fourth MOSFET's drain. Also, the source of the sixth MOSFET 22 is connected to the juncture 40 of the second MOSFET's source and the third MOSFET's drain. The first, fourth and fifth MOSFETs are n-channel devices, while the second, third and sixth MOSFETs are p-channel devices.

In the steady state, when the non-inverting input 32 is high and the inverting input 34 is low, transistor 12 is turned on and transistor 14 is turned off. Since the inverting input 34 is low at this time, transistor 22 is turned on. The combination of these conditions turns transistor 16 on, turns transistor 18 off and pulls the output lead 36 high.

Conversely, when the inverting input 34 is high and the non-inverting input 32 is low, transistors 20 and 14 are turned on and transistors 22 and 12 are turned off. The combination of these conditions turns on transistor 18, turns off transistor 16 and pulls the output lead 36 low.

At node 42, negative feedback works to limit the range of the voltage swings (with state changes) from a low of about 1.5 volts to a high of about 3.5 volts; but the output lead approaches, to within a few tenths of volts at one extreme and five volts at the other extreme. To understand this effect, note that as the voltage at node 42 rises, transistor 18 is turned on and transistor 16 is turned off. This limits the voltage by which node 42 can rise. Consequently, the voltage at node 42 will not vary as much as the voltage at input nodes 32 and 34, which allows the amplifier to operate in the linear region (where its gain is greater) over a wide range of input voltages. That is, the gain in the circuit produces a limiting and stabilizing effect at node 42. Excellent common mode rejection is obtained from the fact that one of transistors 12 and 14 is off at all times and one of transistors 20 and 22 is off at all times. Thus, the voltage common to nodes 32 and 34 will not be amplified much but the differential voltage between those nodes will be amplified greatly. Quiescent current drain is very low since one of transistors 16 and 18 is always off during quiescent operation; thus, there is only a very high impedance path between the power supply and ground.

Having thus described one particular embodiment, various alterations, modifications and improvements will readily occur to those skilled in the art. Such alterations, modifcations and improvements as are made obvious by this disclosure are intended to be part of this description though not expressly stated herein, and are intended to be within the spirit and scope of the invention. Accordingly, the foregoing description is intended to be exemplary only, and not limiting. The invention is limited only as defined in the following claims and equivalents thereto.

What is claimed is:

1. A sense amplifier having non-inverting and inverting inputs for connection, respectively, to first and second bit lines which, in turn, communicate with at least one MOS memory cell, such amplifier also having an output and comprising:
   a. first through sixth MOS transistors, each having source, drain and gate electrodes;
   b. the non-inverting input being connected to the gate electrodes of the first and second MOS transistors;
   c. the drain electrodes of the first and second MOS transistors being connected to each other and to the gate electrodes of the third and fourth MOS transistors;
   d. the source electrodes of the first and fifth MOS transistors being connected to each other and to the drain electrode of the fourth MOS transistor;
   e. the source electrode of the fourth MOS transistor being connected to ground;
   f. the source electrode of the third MOS transistor being connected to the supply voltage;
   g. the drain electrode of the third MOS transistor being connected to the source electrodes of the second and sixth MOS transistors;
   h. the inverting input being connected to the gates of the fifth and sixth MOS transistors; and
   i. the drain electrodes of the fifth and sixth MOS transistors being connected to each other and to the sense amplifier output.

* * * * *